(12) United States Patent
Takeda

(10) Patent No.: US 6,972,410 B2
(45) Date of Patent: Dec. 6, 2005

(54) RADIATION IMAGE TAKING APPARATUS

(75) Inventor: Shinichi Takeda, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 144 days.

(21) Appl. No.: 10/211,641

(22) Filed: Aug. 5, 2002

(65) Prior Publication Data

US 2003/0026382 A1 Feb. 6, 2003

(30) Foreign Application Priority Data

Aug. 6, 2001 (JP) ........................................ 2001-237306
Jul. 24, 2002 (JP) ........................................ 2002-215474

(51) Int. Cl.$^7$ ............................................... G01T 1/24
(52) U.S. Cl. ............................................... 250/370.09
(58) Field of Search ...................... 250/370.09; 378/98.8

(56) References Cited

U.S. PATENT DOCUMENTS

| | | | |
|---|---|---|---|
| 5,804,832 A | 9/1998 | Crowell et al. ............. | 250/580 |
| 6,495,836 B1 * | 12/2002 | Hata ...................... | 250/370.09 |
| 6,567,611 B1 * | 5/2003 | Soga ........................... | 386/107 |
| 2002/0011572 A1 * | 1/2002 | Kajiwara et al. ...... | 250/370.11 |
| 2002/0079458 A1 * | 6/2002 | Zur ........................ | 250/370.11 |
| 2002/0122000 A1 * | 9/2002 | Bradley et al. ............... | 342/22 |

FOREIGN PATENT DOCUMENTS

| | | | |
|---|---|---|---|
| JP | 9-129857 | 5/1997 | ........... H01L/27/14 |
| JP | 2001-504940 | 4/2001 | ............. G01T/1/24 |

* cited by examiner

Primary Examiner—Constantine Hannaher
(74) Attorney, Agent, or Firm—Fitzpatrick, Cella, Harper & Scinto

(57) ABSTRACT

A radiation image taking apparatus having a radiation detecting unit which includes a plurality of photo-electric conversion elements and converts radiation into an electrical signal, a plate-like support member which supports the radiation detecting unit, an analog circuit unit having at least one of functions of controlling the radiation detecting unit, receiving an analog signal from the radiation detecting unit, processing the analog signal, and converting the analog signal into a digital signal, a digital circuit unit having at least one of functions of controlling at least one of the other units and communicating with a unit outside the apparatus, and a power circuit unit for supplying power to at least one of other units. The analog circuit unit, the digital circuit unit, and the power circuit unit are formed on separate circuit boards, respectively, and the analog circuit unit and the digital circuit unit are arranged on the opposite side of the radiation detecting unit with respect to the support member.

20 Claims, 3 Drawing Sheets

RADIATION IMAGE TAKING APPARATUS

BACKGROUND OF THE INVENTION

1. Field of the Invention

The present invention relates to a radiation image taking apparatus using photo-electric conversion elements.

2. Related Background Art

Conventionally, a read apparatus in a facsimile apparatus, copying machine, scanner, radiographic apparatus, or the like uses a system constituted by a combination of a reduction optical system and a CCD sensor.

Recently, with the development of photoelectric conversion semiconductor materials typified by hydrogenated amorphous silicon (a-Si), a contact sensor has been developed, which is obtained by forming a photo-electric conversion element and a signal processing unit on a large-area board and designed to perform read operation by using an optical system obtaining an image equal in size to an information source.

Since a-Si, in particular, can be used not only as a photo-electric conversion element material but also as a semiconductor material for TFTs (Thin-Film Transistors), a photo-electric conversion semiconductor layer and a semiconductor layer of a TFT can be simultaneously formed.

FIG. 5 is a sectional view of a conventional electronic cassette. An electronic cassette 1 used for radiography has a support member 3 placed in an outer cover 2. A radiation detecting unit 4 formed by sequentially stacking pixels 4b arranged in a matrix pattern, each constituted by a photo-electric conversion element and signal transfer element (the above TFT or the like) for converting visible light into an electrical signal and transferring the signal to an external circuit, and a scintillator 4c for converting radiation or the like into visible light is supported on a board 4a on the support member 3. An electric circuit board 5 on which an electronic component for processing an electrical signal obtained by photo-electric conversion by the radiation detecting unit 4 and the like are mounted is placed on the lower surface of the support member 3. This electric circuit board 5 is connected to each pixel 4b through an interconnection 6. In addition, a power supply circuit board 8 is connected to the electric circuit board 5 through a power supply interconnection 7.

The circuits mounted on the electric circuit board 5 include a photo-electric conversion element driving and reading circuit for generating a potential to be applied into the radiation detecting unit 4 and performing signal processing of receiving a signal from a photo-electric conversion element and converting it into serial data, a signal transfer element driving circuit for driving the signal transfer element, an A/D conversion circuit for converting the analog signal detected by the radiation detecting unit 4 and processed by the photo-electric conversion element driving and reading circuit into a digital signal, and an I/F (interface) circuit for generating a control signal for controlling each circuit and transmitting/receiving a signal for controlling the driving operation of the photo-electric conversion unit and aforesaid digital signal to/from an external unit.

With these circuits, this apparatus performs control on the radiation detecting unit 4, a read of a detection signal, conversion to a digital signal, and data transfer to an external digital processor.

The power supply circuit board 8 is constituted by a battery and DC/DC power supply circuit. Alternatively, a predetermined voltage may be externally applied to the radiation image taking apparatus through a power cable (not shown), and different voltages may be generated by the DC/DC power supply.

In the above prior art, however, the pixel 4b handles an electrical signal with a very low level, and hence is susceptible to electromagnetic noise. If the pixel 4b is affected by this electromagnetic noise, noise is superimposed on a taken image, resulting in a deterioration in image quality.

Switching noise produced from the power supply circuit board 8 incorporated in the outer cover 2 is a big factor that causes electromagnetic noise. Another factor is noise produced from an electric circuit, especially a digital circuit or the like.

In addition, the power supply interconnection 7 that connects the power supply circuit board 8 to the respective circuits and the interconnection 6 for distributing control signals for controlling the respective circuits to them also become similar noise sources.

Assume that circuits are integrally formed on one board due to limitations on mount spaces for the circuits and the like. In this case, an analog circuit (e.g., a photo-electric conversion element driving and reading circuit) that handles weak analog signals detected by the radiation detecting unit 4 and a digital circuit such as an I/F circuit serving to generate signals for controlling the respective circuits are mounted on the same board. In addition, a circuit for reading/scanning the pixels 4b and a circuit for transmitting/receiving signals which are asynchronous with the scanning (frame period) are formed on the same board.

Stray capacitances, in particular, between circuits through an insulating layer of the electric circuit board 5, which is made of epoxy resin or the like and has a large dielectric constant, becomes a load to cause noise interference between the circuits. As a consequence, noise originated from a digital signal is superimposed on an analog signal, resulting in a deterioration in image quality.

In addition, although a digital circuit is more resistant to noise than an analog circuit, an increase in the number of digital circuits around a digital circuit is not preferred because of an increase of the number of noise sources.

SUMMARY OF THE INVENTION

It is an object of the present invention to solve the above problem and provide a radiation image taking apparatus which can obtain a high-quality image with reduced influence of noise.

According to the present invention, there foregoing object is attained by providing a radiation image taking apparatus comprises a radiation detecting unit which includes a plurality of photoelectric conversion elements and converts radiation into an electrical signal;

a plate-like support member which supports the radiation detecting unit, an analog circuit unit having at least one of functions of controlling the radiation detecting unit, receiving an analog signal from the radiation detecting unit, processing the analog signal, and converting the analog signal into a digital signal, a digital circuit unit having at least one of functions of controlling at least one of other units and communicating with a unit outside the apparatus, and a power circuit unit for supplying electric power to at least one of other units, wherein the analog circuit unit, the digital circuit unit, and the power circuit unit are formed on separate circuit boards, respectively, and the analog circuit unit and the digital circuit unit are arranged in the opposite side of the radiation detecting unit in respect to the support member.

According to another aspect of the present invention, there foregoing object is attained by providing the power circuit unit is placed outside a region formed from all normals of a supporting surface of the support member.

According to another aspect of the present invention, there foregoing object is attained by providing a shield wall having a noise shield function is provided for between at least two of the radiation detecting unit, the analog circuit unit, the digital circuit unit, and the power circuit unit.

According to another aspect of the present invention, there foregoing object is attained by providing the shield wall is provided for by the support member.

According to another aspect of the present invention, there foregoing object is attained by providing the shield wall is provided for by an outer cover of the apparatus.

According to another aspect of the present invention, there foregoing object is attained by providing the digital circuit unit is placed adjacent to the power circuit unit.

According to another aspect of the present invention, there foregoing object is attained by providing the digital circuit unit includes a first digital circuit unit for controlling a read of an analog signal from the radiation detecting unit and a second digital circuit unit different from the first digital circuit unit, and the power supply circuit unit, the first digital circuit unit, and the second digital circuit unit are formed on separate circuit boards, respectively, and arranged in the order named along a predetermined direction along the supporting surface of the support member.

According to another aspect of the present invention, the analog circuit unit includes a first analog circuit unit for performing at least one of processing of the analog signal and conversion from the analog signal into a digital signal, and the power circuit unit, the first digital circuit unit, the second digital circuit unit, and the first analog circuit unit are formed on separate circuit boards, respectively, and arranged in the order named along a predetermined direction along the supporting surface of the support member.

According to another aspect of the present invention, there foregoing object is attained by providing a detection surface of the radiation detecting unit is substantially rectangular, the analog circuit unit includes a second analog circuit which receives an analog signal from the radiation detecting unit and is formed on a circuit board different from other circuit units, the first digital circuit unit is placed along a first side of the detection surface, and the second analog circuit unit is placed along a second side of the detection surface which is perpendicular to the first side.

According to another aspect of the present invention, there foregoing object is attained by providing the first digital circuit unit is divided into units, the first digital circuit units are respectively arranged along the first side of the detection surface and a third side opposing the first side, the second analog circuit unit is divided into units, and the second analog circuit units are respectively arranged along the second side of the detection surface and a fourth side opposing the second side.

Other objects, features and advantages of the present invention will be apparent from the following descriptions taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the descriptions, serve to explain the principle of the invention.

DETAILED DESCRIPTION OF THE PREFERRED EMBODIMENTS

A preferred embodiments of the present invention will be described in detail in accordance with the accompanying drawings of FIGS. 1 to 4. In the following embodiments, a medical X-ray image taking apparatus for radiographing the human body by using X-rays will be described as an example of the radiation image taking apparatus according to the present invention. However, the present invention can also be applied to an X-ray image taking apparatus for taking an image of another kind of object or an image taking apparatus using another kind of radiation.

The present invention will be described in detail with reference to the embodiments shown in FIGS. 1 to 4.

(First Embodiment)

Figure 1:
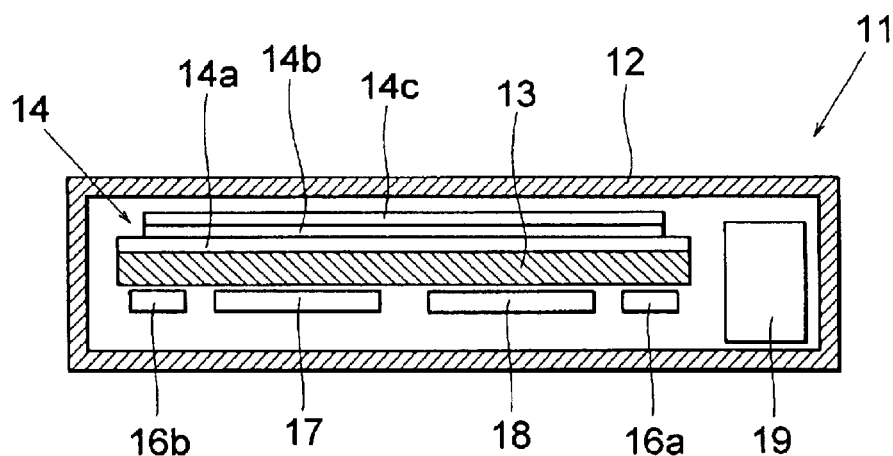
FIG. 1 is a sectional view of the first embodiment.
Figure 2:
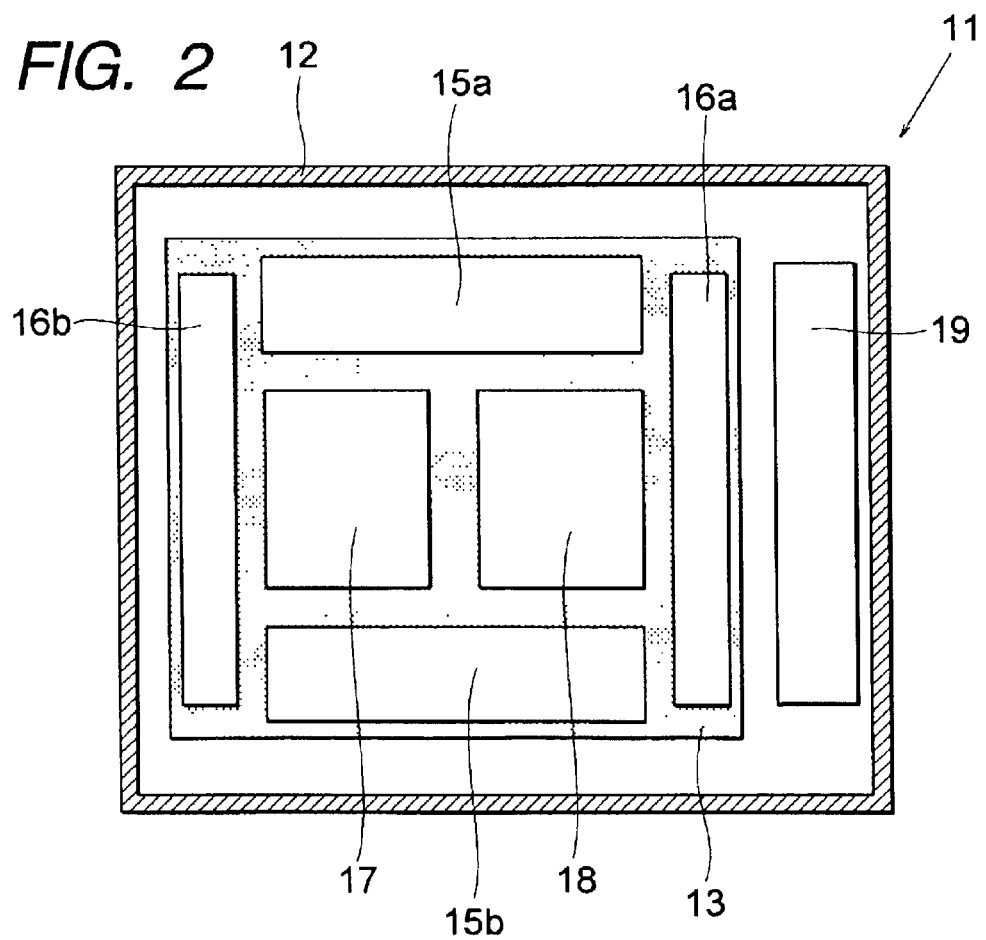
FIG. 2 is a plan view of the first embodiment.

FIG. 1 is a sectional view of a radiation image taking apparatus according to the first embodiment. FIG. 2 is a plan view of the radiation image taking apparatus seen through the outer cover from the lower surface side. A radiation image taking apparatus 11 has a plate-like support member 13 in an outer cover 12. These components are made of a metal such as aluminum or magnesium. The outer cover 12 and support member 13 are electrically connected to each other by fitting, with screws, or the like in an assembly process, and grounded at proper portions.

A board 14a, an image detection element 14b (forming a detection surface for a visible light image, i.e., a radiation image) formed by arranging photo-electric conversion elements and signal transfer elements in a matrix pattern which convert visible light into electrical signals and transfer the signals to an external circuit, and a scintillator 14c for converting X-rays into visible light are sequentially stacked on the support member 13, thus forming a radiation detecting unit 14. Note that the radiation detecting unit is not limited to such an arrangement. For example, a direct conversion type radiation detecting unit may be used, which directly converts radiation into an electrical signal by using a photo-electric conversion element without the mediacy of a scintillator.

On the lower surface of the support member 13, the following boards are separately mounted: photoelectric conversion element driving and reading circuit boards 15a and 15b on which photo-electric conversion element driving and reading circuits for generating potentials to be applied into the photoelectric conversion elements and performing signal processing of receiving signals from the photoelectric conversion elements and converting them into serial data are formed and electric components, connectors, and the like (not shown) are mounted; signal transfer element driving circuit boards 16a and 16b on which signal transfer element driving circuits for driving the signal transfer elements of the radiation detecting unit 14 are formed; and an A/D conversion (analog-digital conversion) circuit board 17 for converting the analog signals detected by the photo-electric conversion elements and processed by the photo-electric conversion element driving and reading circuits into digital signals. Since the photo-electric conversion element driving and reading circuit boards 15a and 15b and signal transfer element driving circuit boards 16a and 16b, in particular, are directly connected to the radiation detecting unit 14 for transmitting/receiving weak signals, noise must be minimized. Therefore, these circuit boards are preferably positioned as near to an interconnection portion (not shown) formed on the outer periphery of the board 14a as possible. As shown in FIG. 1, these boards are arranged near the outer periphery of the board 14a (the outer periphery of the lower surface of the support member 13).

An I/F circuit board 18 is also mounted on the lower surface of the support member 13. An I/F circuit for generating control signals for controlling the respective circuits on the photoelectric conversion element driving and reading circuit boards 15a and 15b, signal transfer element driving circuit boards 16a and 16b and A/D conversion circuit board 17, and transmitting/receiving control signals for controlling the driving operation of the radiation detecting unit 14 and digital image signals detected by the photo-electric conversion elements to/from an external unit is formed on the I/F circuit board 18. External control signals are input to the I/F circuit board 18 through a cable or the like. The I/F circuit board 18 performs control on the operation and detection timing of the radiation detecting unit 14, data transfer to an external digital processor, and the like in accordance with the inputs.

The respective circuit boards and the radiation detecting unit 14 are connected to each other through connectors, solder lands, and the like mounted on a circuit by an interconnection means (not shown) such as a flexible board made of polyimide resin or the like.

Electric components, connectors, and the like are mounted on a power supply circuit board 19. The power supply circuit board 19 is placed outside the support member 13 so as not to overlap the radiation detecting unit 14 when viewed from the direction of the normal to the radiation detecting unit 14. Power required for operation is supplied to the power supply circuit board 19 from outside the radiation image taking apparatus 11 through a cable, connectors, and the like. A DC/DC converter in the power supply circuit board 19 generates a desired potential used inside the radiation image taking apparatus 11.

In addition, the radiation detecting unit 14 and driving and reading circuit boards 15a and 15b which transmit weak signals must be separated from the power supply circuit board 19 which is the largest noise source as far as possible or the area thereof adjacent to the power supply circuit board 19 must be minimized. For this reason, the power supply circuit board 19 is placed on a side of the radiation detecting unit 14 to minimize the influence of noise from the power supply circuit board 19.

Note that the I/F circuit board 18 is formed from a pure digital circuit and has a data transfer circuit for transferring digitized detection signal. Since this data transfer circuit is connected to an external unit, the I/F circuit board 18 is placed on the lower surface of the support member 13 so as to be adjacent to the power supply circuit board 19 which receives external power, thereby minimizing external interconnections (wiring, not shown).

The power supplies generated by the power supply circuit board 19 are connected to the A/D conversion circuit board 17. Necessary power is distributed to the I/F circuit board 18, driving and reading circuit boards 15a and 15b, and the like through the A/D conversion circuit board 17. Note that the interconnections from the power supply circuit board 19 are routed to the A/D conversion circuit board 17 over the driving circuit board 16a and I/F circuit board 18 which handle only digital signals and have relatively high noise resistance.

On the other hand, control signals for controlling the respective circuit boards are all generated by a memory or timing generator on the I/F circuit board 18 on the basis of the supply of power and external control signals, and are sent to the A/D conversion circuit board 17 through connection means arranged on adjacent portions of the two boards. In addition, control signals required for the operation of the radiation detecting unit 14 and reading of detection signals are supplied from the A/D conversion circuit board 17 to the driving and reading circuit boards 15a and 15b through connection means arranged on adjacent portions of the two boards.

Note that detection signals from the photoelectric conversion elements of the image detection element 14b of the radiation detecting unit 14 are distributed to the driving and reading circuit boards 15a and 15b arranged vertically in FIG. 2, and lines for controlling the signal transfer elements are distributed to the driving circuit boards 16a and 16b arranged laterally in FIG. 2. This makes it possible to decrease the number of connection terminals per side of the board 14a and hence to prevent an increase in the size of the board 14a. In addition, the number of shared pixels per line can be decreased, and the driving and processing speeds can be increased.

In addition, since the A/D conversion circuit board 17 needs to receive detected analog signals from the driving and reading circuit boards 15a and 15b, the A/D conversion circuit board 17 and I/F circuit board 18 are separately arranged in the lateral direction, and the A/D conversion circuit board 17 is located near the two driving and reading circuit boards 15a and 15b. This minimizes the routing of interconnections that connect the two circuit boards to each other.

As described above, since the driving and reading circuit boards 15a and 15b, driving circuit boards 16a and 16b, A/D conversion circuit board 17, I/F circuit board 18, and power supply circuit board 19 are separately formed on the respective circuit boards, only necessary power and control signals can be distributed to the respective circuit boards, thereby minimizing noise sources for the respective circuits. In addition, since the respective circuit boards are separated from each other, the stray capacitances between the respective circuit interconnections become small loads through air. This makes it possible to effectively suppress noise interference between the respective circuits. In addition, since the number of intermediate conducive layers required for each circuit board can be determined, even if many intermediate conductive layers are required for some of circuit boards, there is no need to match the numbers of layers on the remaining circuit boards with the above number of layers. Therefore, the total cost required for the circuit boards can be reduced.

In addition, as in this embodiment, for example, interconnections for power from the power supply circuit board 19 and control signals from the I/F circuit board 18 are arranged so as not to be routed over the driving and reading circuit boards 15a and 15b and A/D conversion circuit board 17, which handle analog signals, depending on the arrangement of the respective circuit boards, the interconnections between the respective circuit boards, and the interconnections between the respective circuit boards and radiation detecting unit 14. This also makes it possible to minimize the influences of noise from noise sources through the interconnections.

(Second Embodiment)

Figure 3:
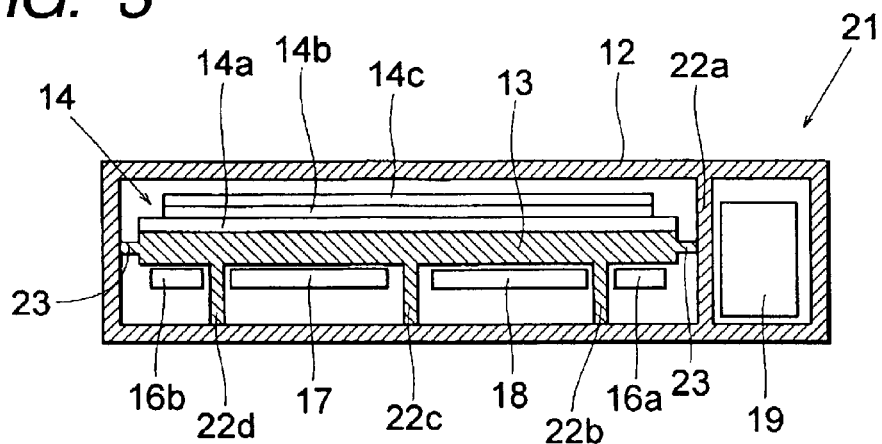
FIG. 3 is a sectional view of the second embodiment.
Figure 4:
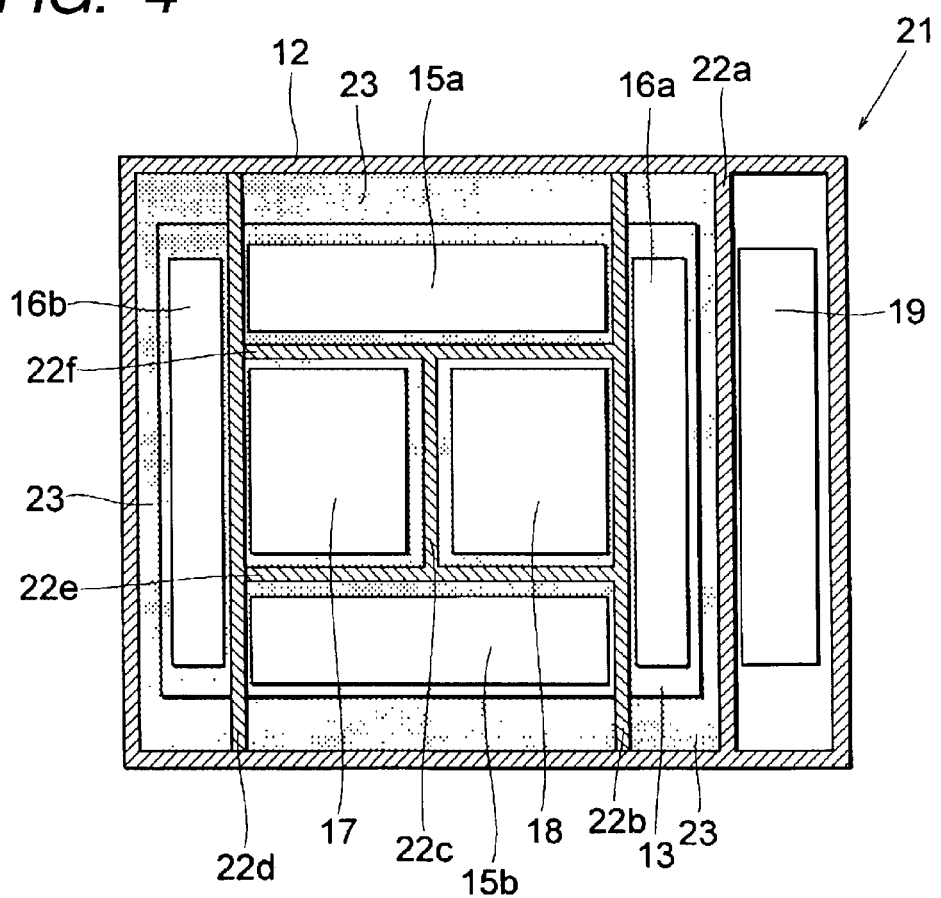
FIG. 4 is a plan view of the second embodiment.
Figure 5:
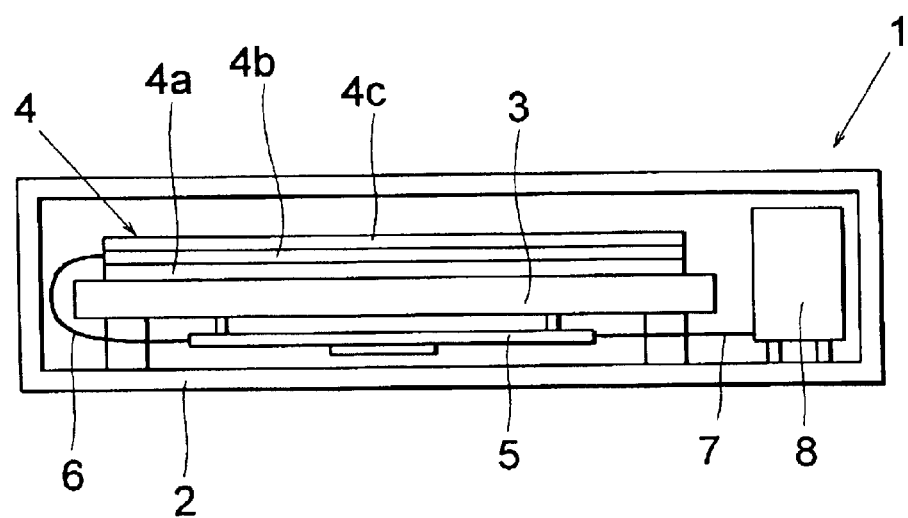
FIG. 5 is a sectional view of the prior art.

FIG. 3 is a sectional view of a radiation image taking apparatus according to the second embodiment. FIG. 4 is a plan view of the radiation image taking apparatus seen through the outer cover from the lower surface side. Note that the same reference numerals as in the first embodiment denote the same parts in the second embodiment.

As in the first embodiment, photo-electric conversion element driving and reading circuit boards 15a and 15b, signal transfer element driving circuit boards 16a and 16b, A/D conversion circuit board 17, and I/F circuit board 18 are arranged on the lower surface of a support member 13 of a radiation image taking apparatus 21. In addition, a power supply circuit board 19 is placed outside a radiation detecting unit 14 so as not to overlap. Furthermore, the arrangement of the respective circuit boards, the interconnections between the respective circuit boards, and the interconnections between the respective circuit boards and the radiation detecting unit 14 are the same as those in the first embodiment.

In the radiation image taking apparatus 21 of this embodiment, shield walls 22a to 22f are arranged between the respective circuit boards to spatially shield (isolate) the respective circuit boards from each other. In addition, the radiation detecting unit 14 and the respective circuit boards are spatially shielded from each other by a shield wall 23 formed between an outer cover 12 and the support member 13. The shield wall 22a that isolates the power supply circuit board 19 from the remaining circuit boards is made of the same material as that for the outer cover 12. The shield walls 22b to 22f and 23 are made of the same material as that for the support member 13. The shield wall 22a, and the shield walls 22b to 22f and 23 are integrally formed with the outer cover 12 and support member 13, respectively.

In the second embodiment, the same effects as those of the first embodiment can be obtained. In addition, since the shield walls 22a to 22f and 23 made of the same material as that for the outer cover 12 and support member 13 are provided, the respective circuit boards are spatially shielded from each other by the outer cover 12, support member 13, and shield walls 22a to 22f and 23, thereby reducing the influence of noise on the respective board circuits and radiation detecting unit 14.

In this embodiment, the outer cover 12 and support member 13 are made of a metal such as aluminum or magnesium. However, the present invention is not limited to this. For example, a member formed by plating a base made of a resin such as PC (polycarbonate) with a metal such as copper or the like can be used because it has a noise shield (mainly an electric field shield) effect. Alternatively, a member whose noise shield (mainly magnetic field shield) effect is improved by coating a resin base or the like with a magnetic powder can be used. Obviously, a member made of a material having high X-ray transmission and light shielding characteristics is used for a portion of the outer cover on which X-rays are incident.

As has been described above, even if the respective members are arranged close to each other because of high-density packing for a reduction in size, the noise interferences between circuits can be reduced by forming the respective circuits on separate circuit boards. This makes it possible to obtain a low-noise, high-quality image. This arrangement is therefore effective in reducing the size and weight of an electronic cassette whose size and weight tend to increase as compared with a conventional film cassette housing a film.

In addition, since the shield walls are integrally formed with the support member or outer cover between the respective circuit boards to spatially shield the respective circuit boards by at least one of the support member or outer cover, the noise interferences between the respective circuits can be further reduced. This makes it possible to obtain a low-noise, high-quality image.

The present invention is not limited to the above embodiments and various changes and modifications can be made within the spirit and scope of the present invention. Therefore to apprise the public of the scope of the present invention, the following claims are made.

What is claimed is:

1. A radiation image taking apparatus comprising:
    a radiation detecting unit which includes a plurality of photo-electric conversion elements and converts radiation into an electrical signal;
    a plate-like support member which supports said radiation detecting unit;
    an analog circuit unit having at least one of functions of controlling said radiation detecting unit, receiving an analog signal from said radiation detecting unit, processing the analog signal, and converting the analog signal into a digital signal;
    a digital circuit unit having at least one of functions of controlling at least one of a plurality of other units, and communicating with a unit outside the apparatus; and
    a power circuit unit for supplying electric power to at least one of the plurality of other units,
    wherein said analog circuit unit, said digital circuit unit, and said power circuit unit are formed on separate circuit boards, respectively, and said analog circuit unit and said digital circuit unit are arranged on the opposite side of said radiation detecting unit with respect to said plate-like support member.

2. An apparatus according to claim 1, wherein said power circuit unit is placed outside a region formed from all normals of a supporting surface of said plate-like support member.

3. An apparatus according to claim 2, wherein said digital circuit unit is placed adjacent to said power circuit unit.

4. An apparatus according to claim 3, wherein said digital circuit unit includes a first digital circuit unit for controlling reading of an analog signal from said radiation detecting unit and a second digital circuit unit different from said first digital circuit unit, and said power circuit unit, said first digital circuit unit, and said second digital circuit unit are formed on separate circuit boards, respectively, and arranged in the order named along a predetermined direction along said supporting surface of said plate-like support member.

5. An apparatus according to claim 4, wherein said analog circuit unit includes a first analog circuit unit for performing at least one of processing of the analog signal and converting the analog signal into a digital signal, and said power circuit unit, said first digital circuit unit, said second digital circuit unit, and said first analog circuit unit are formed on separate circuit boards, respectively, and arranged in the order named along a predetermined direction along said supporting surface of said plate-like support member.

6. An apparatus according to claim 4, wherein a detection surface of said radiation detecting unit is substantially rectangular, said analog circuit unit includes a second analog circuit which receives an analog signal from said radiation detecting unit and is formed on a circuit board different from other circuit units, said first digital circuit unit is placed along a first side of the detection surface, and said second analog circuit unit is placed along a second side of the detection surface which is perpendicular to the first side.

7. An apparatus according to claim 6, wherein said first digital circuit unit is divided into units, the first digital circuit units are respectively arranged along the first side of the detection surface and a third side opposing the first side, said second analog circuit unit is divided into units, and the second analog circuit units are respectively arranged along the second side of the detection surface and a fourth side opposing the second side.

8. An apparatus according to claim 1, wherein a shield wall having a noise shield function is provided for between at least two of said radiation detecting unit, said analog circuit unit, said digital circuit unit, and said power circuit unit.

9. An apparatus according to claim 8, wherein said shield wall is provided for by said plate-like support member.

10. An apparatus according to claim 8, wherein said shield wall is provided for by an outer cover of the apparatus.

11. A radiation image taking apparatus comprising:
a radiation detecting unit which includes a plurality of photo-electric conversion elements and converts radiation into an electrical signal;
a plate-like support member which supports said radiation detecting unit;
an analog circuit unit having at least one of functions of controlling said radiation detecting unit, receiving an analog signal from said radiation detecting unit, processing the analog signal, and converting the analog signal into a digital signal; and
a digital circuit unit having at least one of functions of controlling at least one of a plurality of other units and communicating with a unit outside the apparatus;
wherein said analog circuit unit and said digital circuit unit are formed on separate circuit boards, respectively, and said analog circuit and said digital circuit unit are arranged on an opposite side of said radiation detecting unit with respect to said plate-like support member.

12. An apparatus according to claim 11, wherein a shield wall having a noise shield function is provided between at least two of said radiation detecting unit, said analog circuit unit and said digital circuit unit.

13. An apparatus according to claim 12, wherein said shield wall is provided by said plate-like support member.

14. An apparatus according to claim 12, wherein said shield wall is provided by an outer cover of the apparatus.

15. A radiation image taking apparatus comprising:
a radiation detecting unit having a detection surface on which a plurality of photo-electric conversion elements are disposed,
a plate-like support member which supports said radiation detecting unit with a support surface thereof,
a digital driving circuit board for driving the plurality of photo-electric conversion elements,
an analog reading circuit board for reading electric signals outputted from said radiation detecting unit, and
a power circuit board for supplying electric power to at least one of said radiation detecting unit, said digital driving circuit board, and said analog reading circuit board,
wherein said support surface for said radiation detecting unit is a quadrangle support surface of said plate-like support member, said digital driving circuit board and said analog reading circuit board are provided on another surface of said plate-like support member, and a distance between said power circuit board and said digital driving circuit board is shorter than a distance between said power circuit board and said analog reading circuit board.

16. A radiation image taking apparatus according to claim 15, wherein a shield wall having at least one of a noise shield function and a magnetic field shield function is provided between said analog reading circuit board and said digital driving circuit board.

17. A radiation image taking apparatus according to claim 16, wherein said shielding wall is provided on said plate-like support member.

18. A radiation image taking apparatus according to claim 15, wherein said plate-like support member is made of aluminum or magnesium.

19. A radiation image taking apparatus according to claim 15, wherein said plate-like support member includes at least one of a noise shield function and a magnetic field shield function.

20. A radiation image taking apparatus according to claim 15, wherein said radiation image taking apparatus is portable.

* * * * *

UNITED STATES PATENT AND TRADEMARK OFFICE
CERTIFICATE OF CORRECTION

PATENT NO. : 6,972,410 B2  Page 1 of 1
APPLICATION NO. : 10/211641
DATED : December 6, 2005
INVENTOR(S) : Shinichi Takeda It is certified that error appears in the above-identified patent and that said Letters Patent is hereby corrected as shown below:

Column 2,
Line 48, "there" should read -- the --; and
Line 49, "comprises" should read -- comprising --.

Column 3,
Lines 5, 9, 14, 17, 20, 22, 41 and 51, "there" should read -- the --;
Lines 6 and 21, delete "is";
Lines 11, 15 and 18, delete "is provided";
Line 23, "includes" should read -- including --;
Lines 42 and 52, "is" should read -- that is --.

Column 6,
Line 46, "conducive" should read -- conductive --.

Column 9,
Line 33, "circuit" (first occurrence) should read -- circuit unit --.

Column 10,
Line 6, "thereof." should read -- thereof, --;
Line 16, delete "quadrangle"; and
Line 25, "shield" should read -- shielding --.

Signed and Sealed this

Fourth Day of July, 2006

JON W. DUDAS
*Director of the United States Patent and Trademark Office*